United States Patent [19]

Brehm et al.

[11] Patent Number: 5,682,472
[45] Date of Patent: Oct. 28, 1997

[54] METHOD AND SYSTEM FOR TESTING MEMORY PROGRAMMING DEVICES

[75] Inventors: Jeffrey A. Brehm, So. San Francisco; Patrick M. Shepherd, San Jose, both of Calif.

[73] Assignee: Aehr Test Systems, Mountain View, Calif.

[21] Appl. No.: 407,103

[22] Filed: Mar. 17, 1995

[51] Int. Cl.[6] ............................................. G06F 11/00
[52] U.S. Cl. ........................... 395/183.01; 395/184.01; 395/183.21; 395/183.22
[58] Field of Search .................. 395/183.01, 183.03, 395/183.06, 184.01, 183.18, 183.21, 185.07, 185.01, 183.22

[56] References Cited

U.S. PATENT DOCUMENTS

| | | | |
|---|---|---|---|
| 4,379,259 | 4/1983 | Varadi et al. | 324/73 |
| 4,866,714 | 9/1989 | Adams et al. | 371/22.1 |
| 5,263,003 | 11/1993 | Cowles et al. | 365/230.03 |
| 5,274,599 | 12/1993 | Ema | 365/218 |
| 5,287,318 | 2/1994 | Kuki et al. | 365/218 |
| 5,339,320 | 8/1994 | Frandrich et al. | 371/22.1 |
| 5,377,148 | 12/1994 | Rajsuman et al. | 365/201 |
| 5,410,544 | 4/1995 | Kreifels et al. | 371/18 |
| 5,416,782 | 5/1995 | Wells et al. | 371/21.2 |
| 5,448,577 | 9/1995 | Wells et al. | 371/40.1 |
| 5,490,109 | 2/1996 | Salmon | 365/185.17 |
| 5,515,318 | 5/1996 | Cappeletti et al. | 365/185.09 |
| 5,523,972 | 6/1996 | Rashid et al. | 365/185.22 |

OTHER PUBLICATIONS

Marks, G., "Parallel testing of Non-Volatile Memories," 1983, IEEE Computer Society, pp. 738–743.

"Burn-In and test Systems keep pace with new devices," Sep. 1988, Journal article in Evaluation Engineering, vol. 27, Iss. No. 9, pp. 71–73.

Buttner, H.M. et al., "High Speed Logic/Memory tester," IBM Tech. Disclosure Bulletin, vol. 23, No. 5, Oct. 1980, pp. 2030–2031.

Suyko et al., "Development of a burn-in time reduction algorithm . . . ", 1991, IEEE, pp. 264–270.

*Primary Examiner*—Robert W. Beausoliel, Jr.
*Assistant Examiner*—Norman M. Wright
*Attorney, Agent, or Firm*—Cooley Godward LLP

[57] ABSTRACT

A novel system and method for testing semiconductor devices has a pattern generator implementing a test signal algorithm uniquely coupled with a recording system which is an individual hardware system for each device under test. The improved pattern generator and recording system functions in conjunction with a system designed to perform parallel test and burn-in of semiconductor devices, such as the Aehr Test MTX System. The MTX can functionally test large quantities of semiconductor devices in parallel. It can also compensate for the appropriate round trip delay value for each chip select state for each device under test. This system of testing provides an effective and practical method for reducing overall test cost without sacrificing quality.

50 Claims, 12 Drawing Sheets

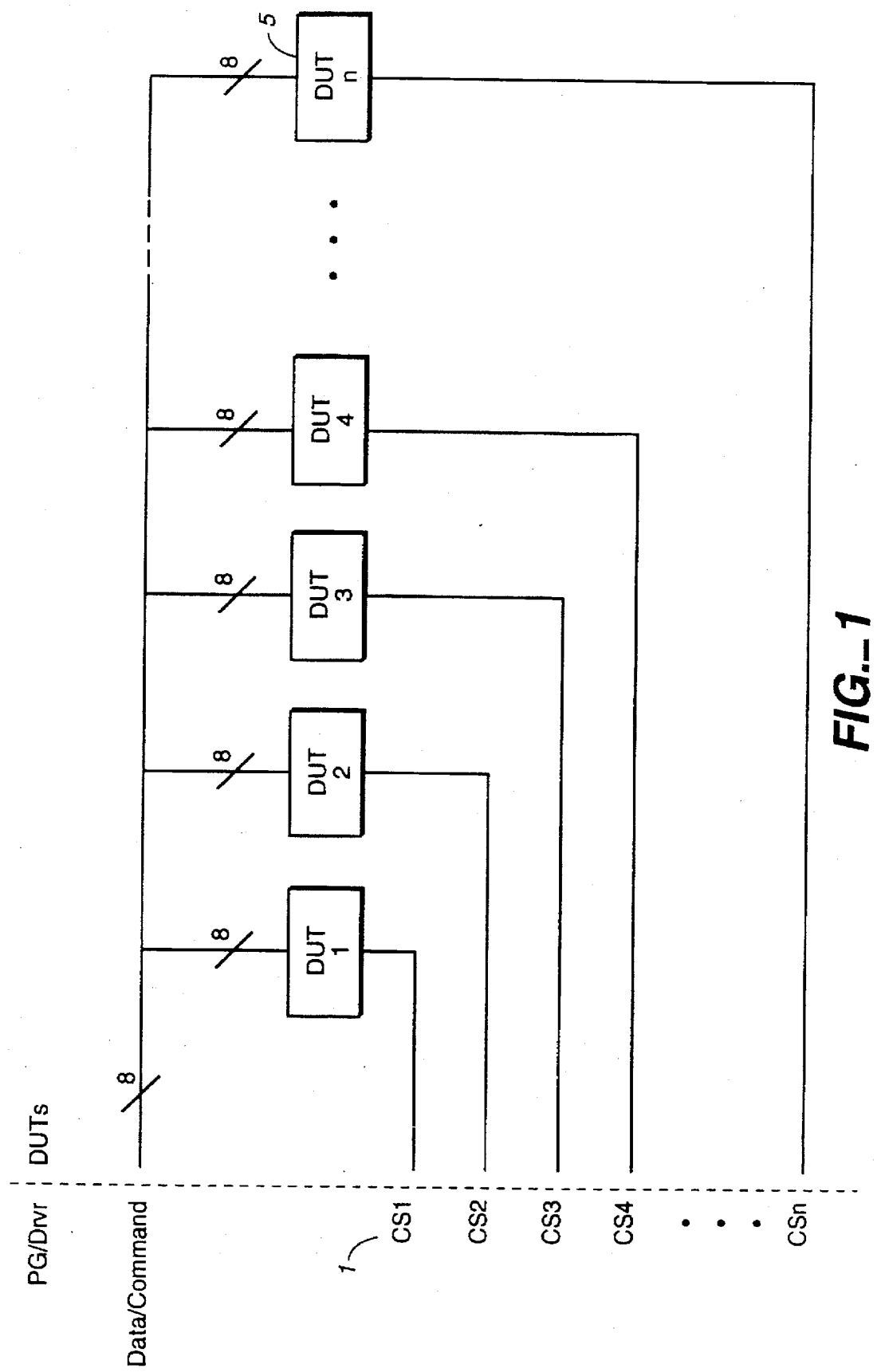
FIG._1

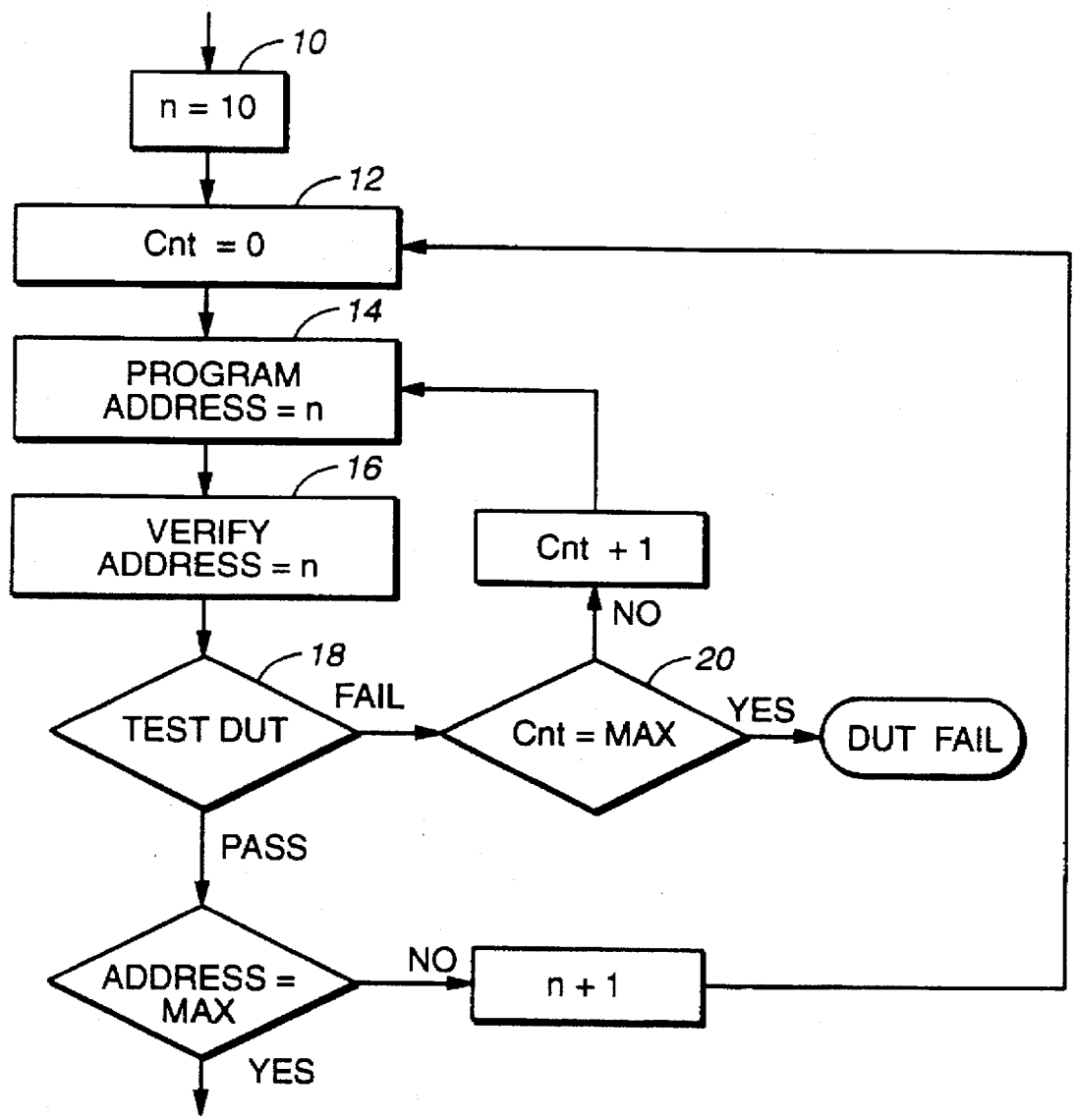
FIG._2

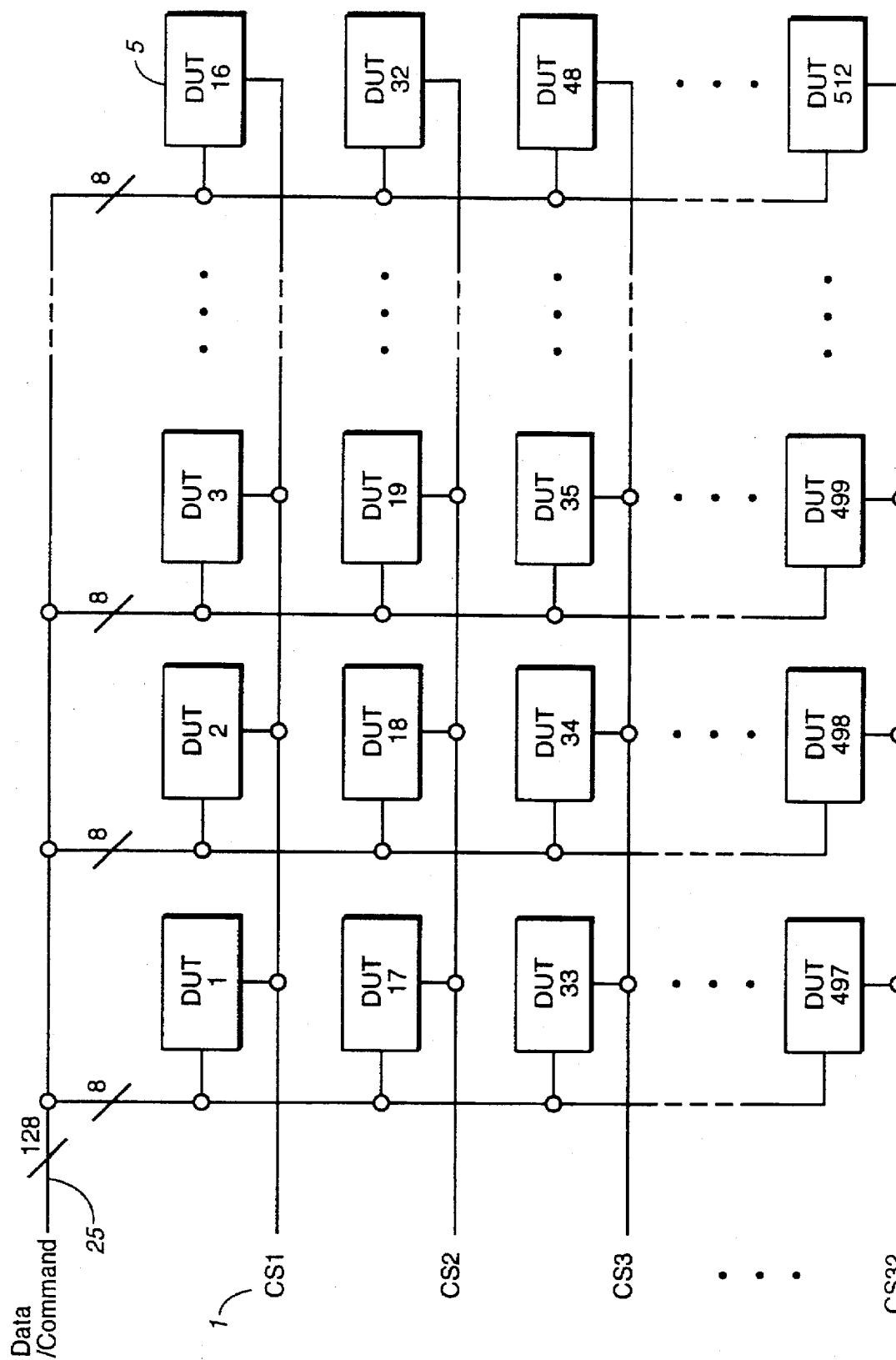
FIG._3

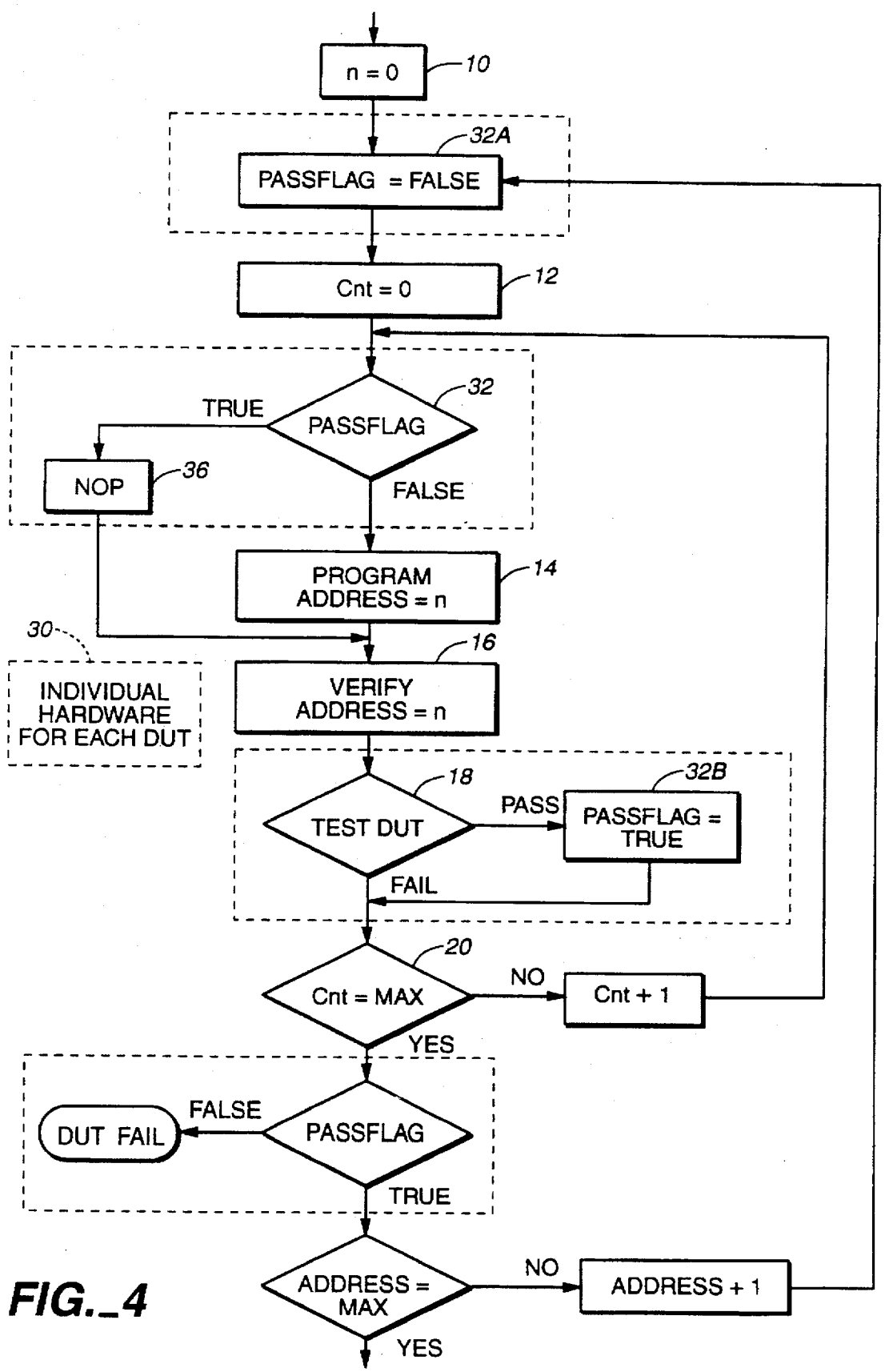
FIG._4

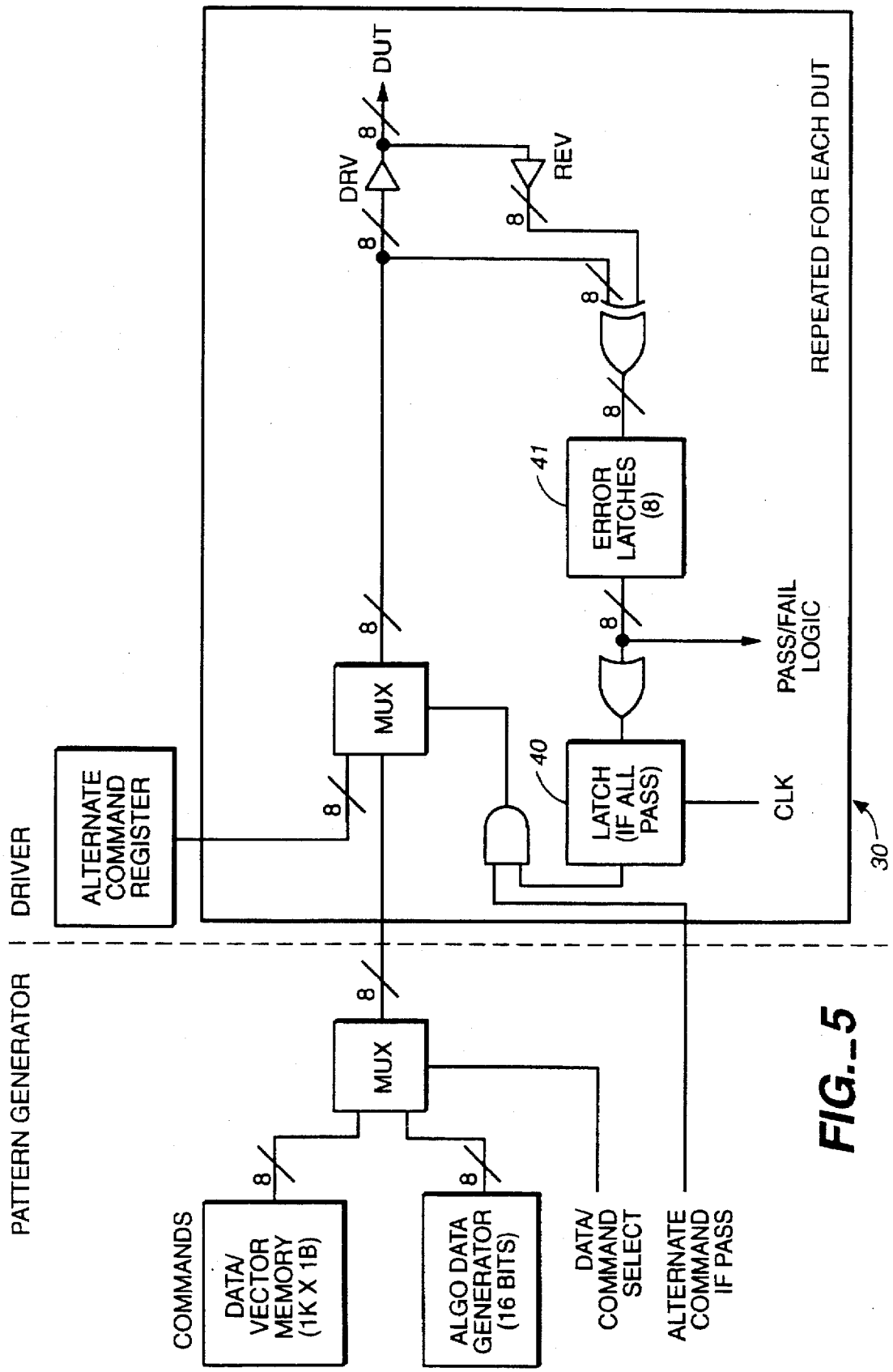
FIG._5

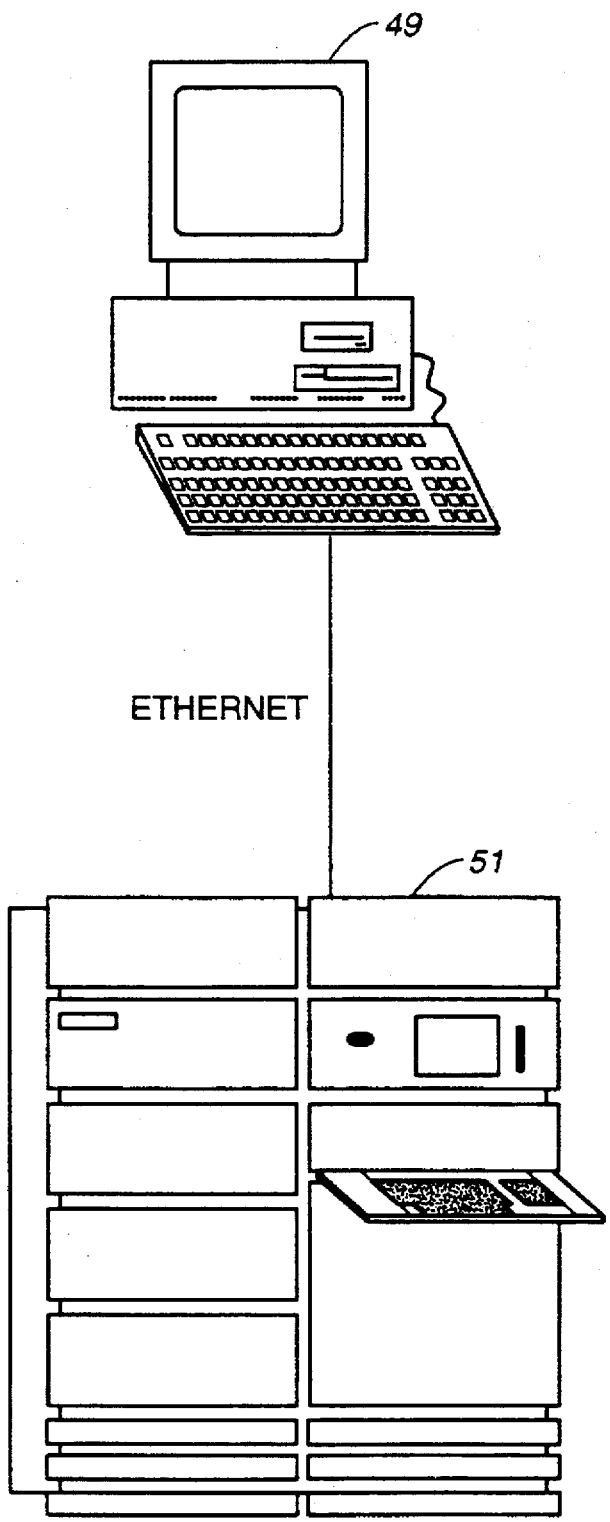
SERVER
- DATABASE ENGINE
- MASTER PROGRAM LIBRARY
- TEST DATA LIBRARY
- REPORT GENERATION
- PROGRAM DEVELOPMENT
- PRODUCTION CONTROL
- NETWORK ADMINISTRATION
ETHERNET
TESTER
- TESTING
- PROGRAM DEBUG
FIG._6

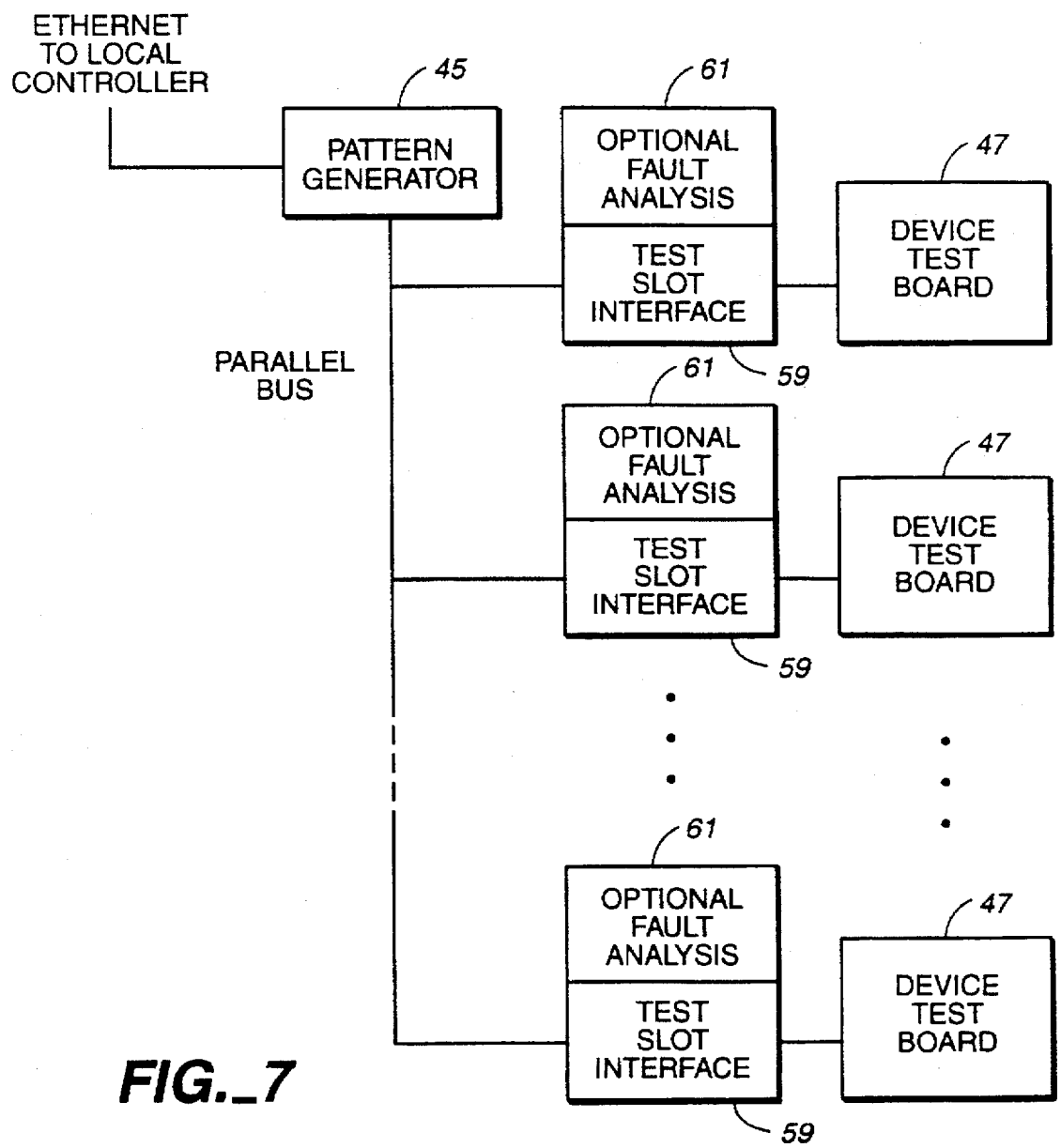
FIG._7

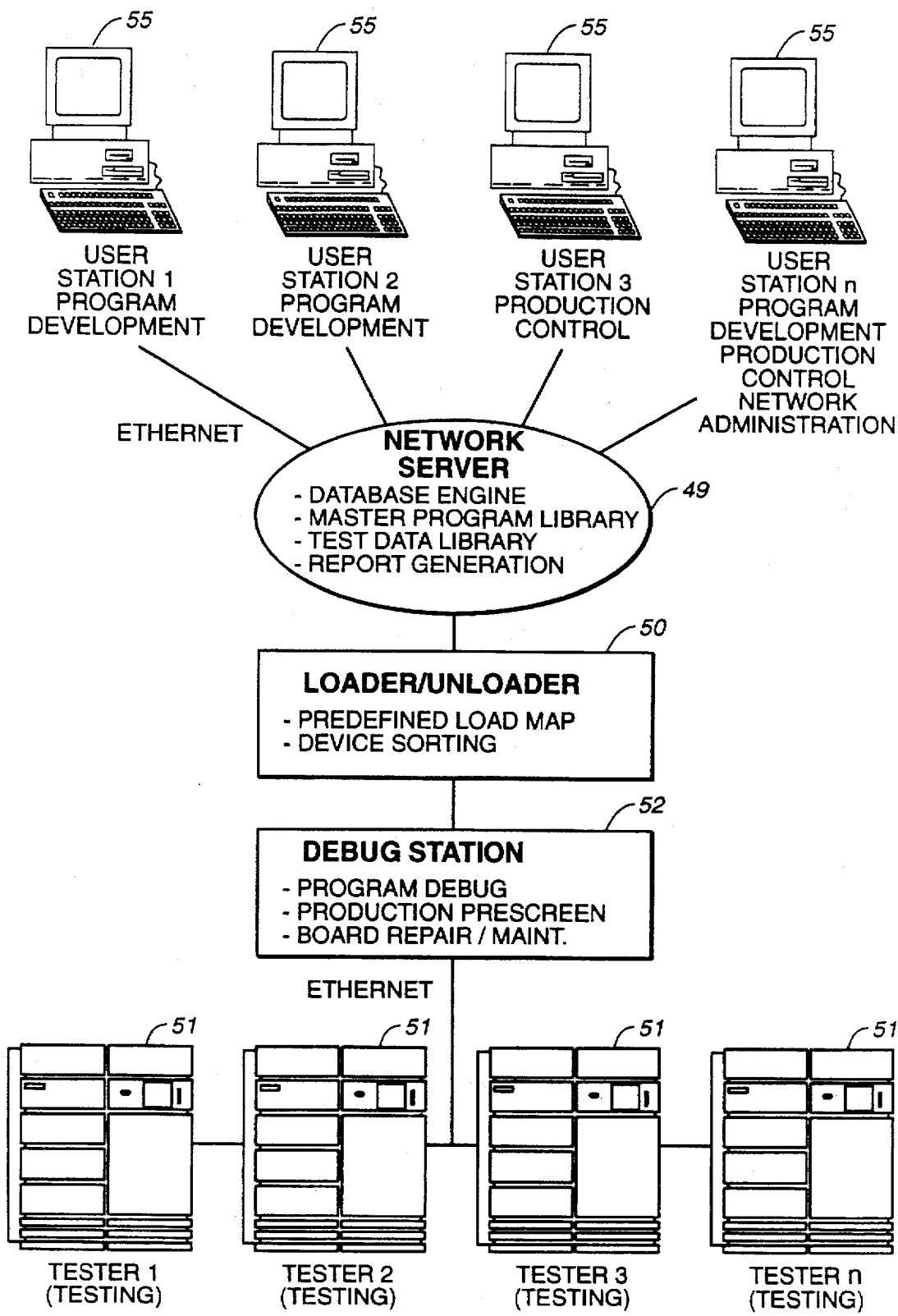
FIG._8

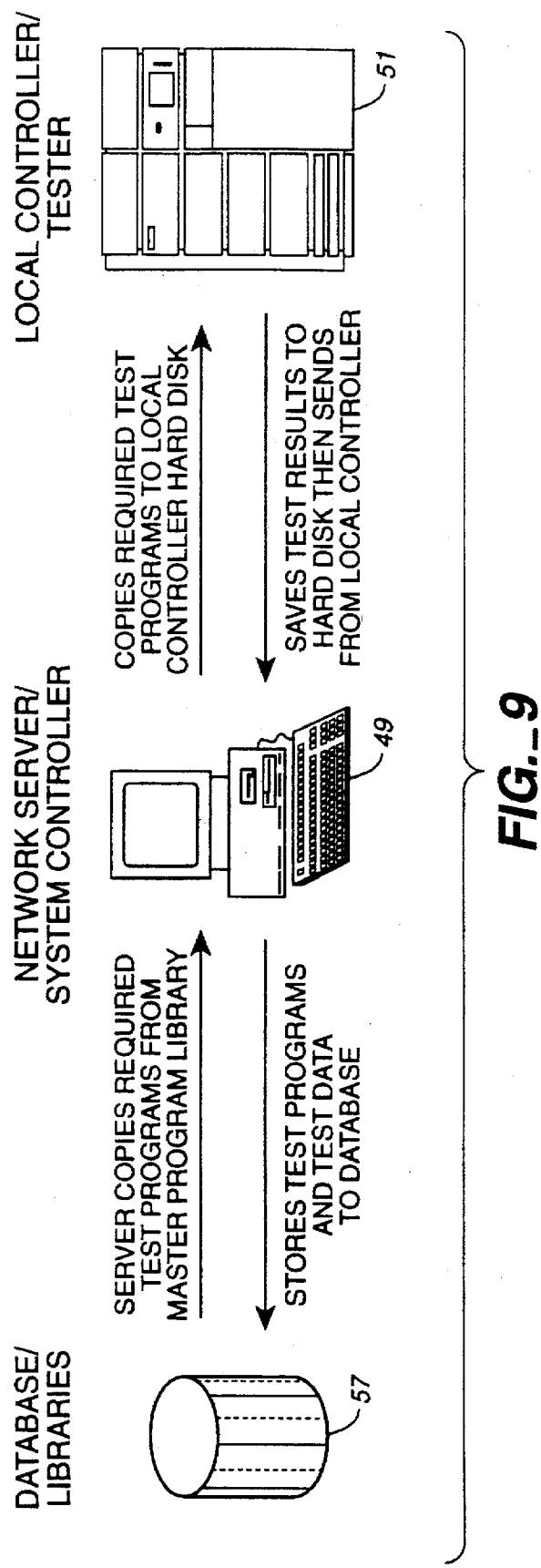
FIG._9

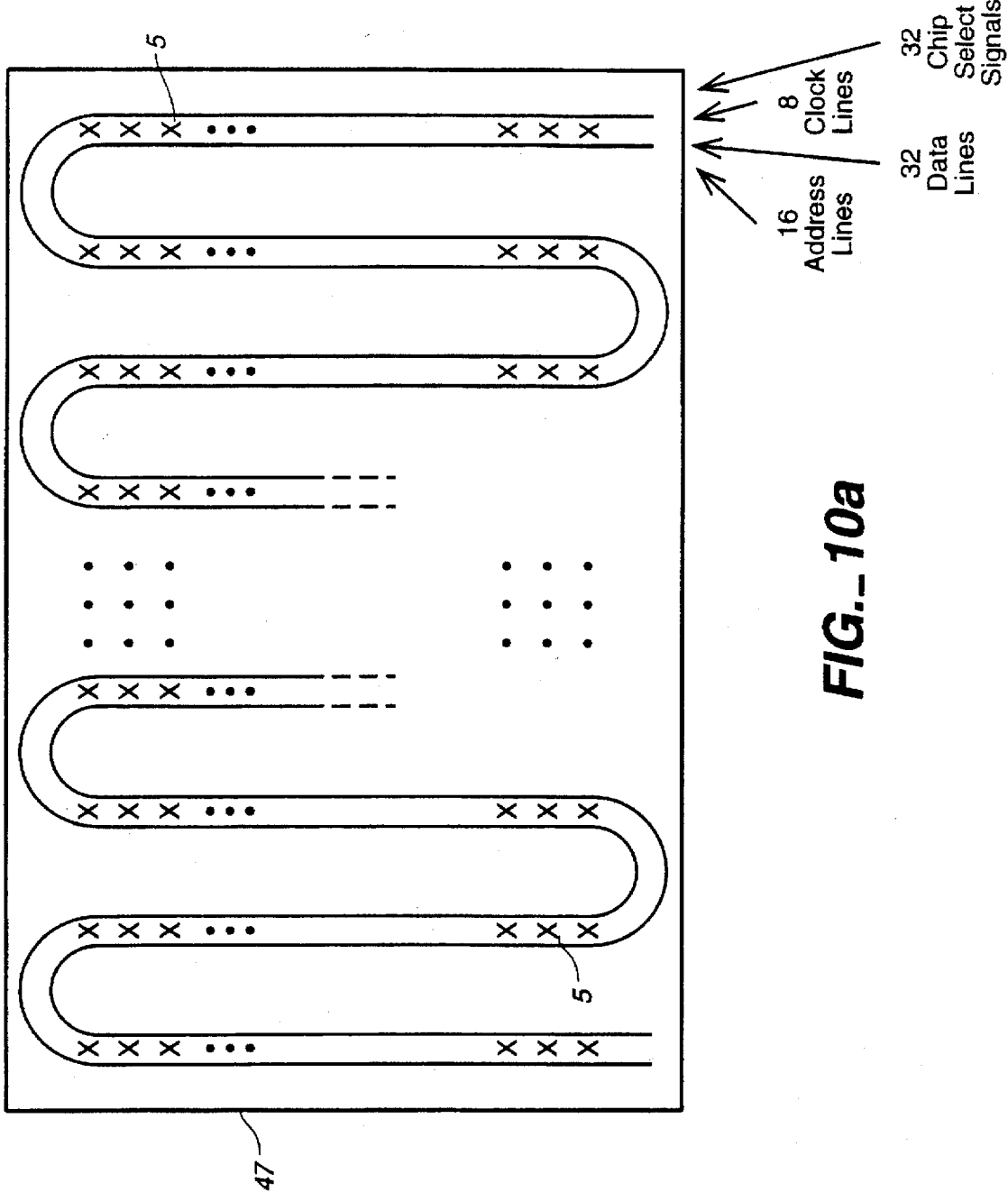
FIG._10a

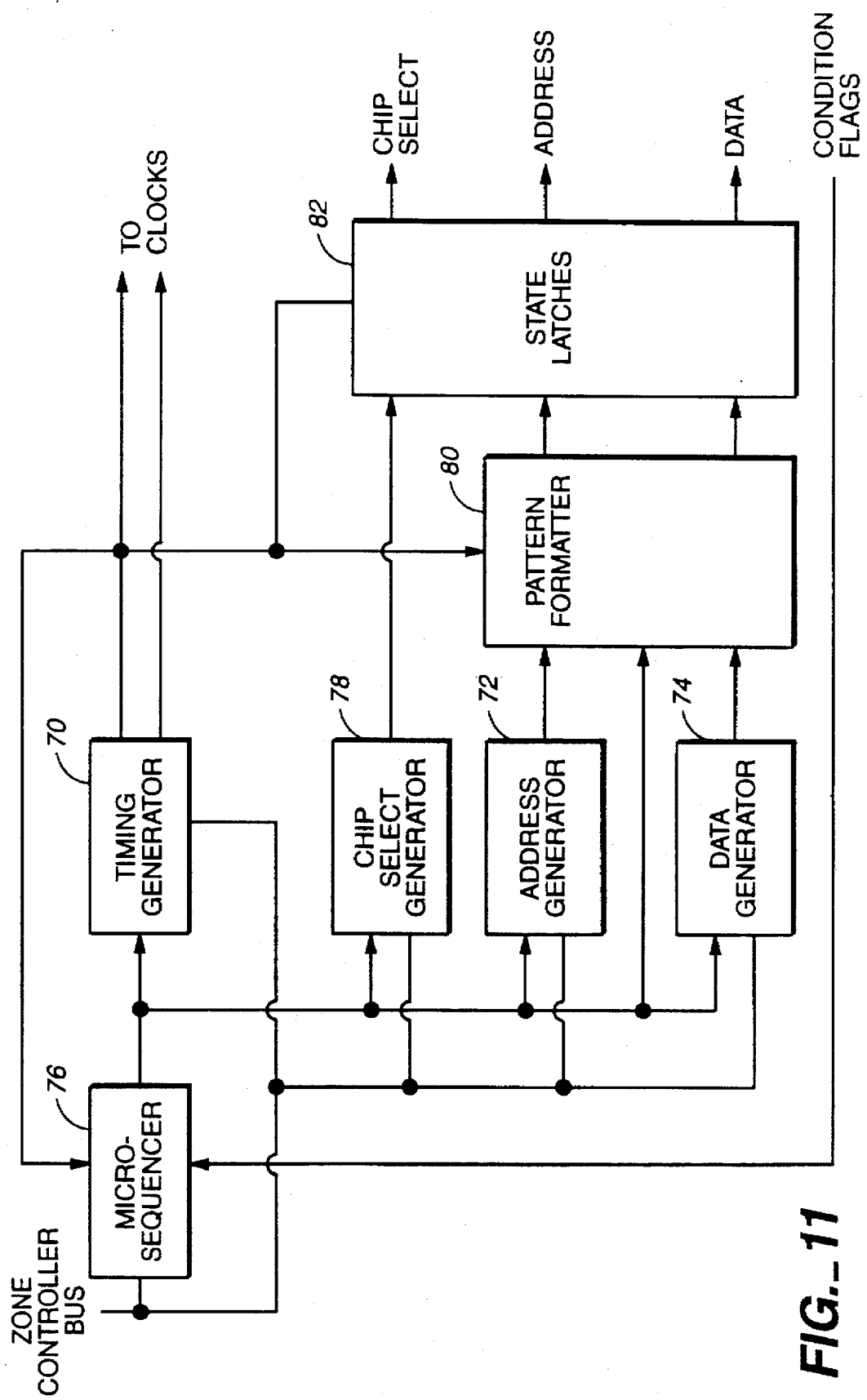
FIG._11

METHOD AND SYSTEM FOR TESTING MEMORY PROGRAMMING DEVICES

BACKGROUND OF THE INVENTION

1. Field of the Invention

The present invention relates generally to a system and method for evaluation of integrated circuits and other semiconductor devices. More particularly, it relates to software coupled with computer hardware which allows efficient testing of a multiplicity of semiconductor devices.

2. Description of the Prior Art

When fabrication of integrated circuits and other semiconductor devices, such as flash memory devices, has been completed, the semiconductor devices are subjected to burn-in and electrical tests in order to identify and eliminate defective semiconductor devices before shipment to a customer. The term "burn-in" relates to operation of an integrated circuit at a predetermined temperature or temperature profile, typically an elevated temperature in an oven. Certain operating electrical bias levels and/or signals are supplied to the semiconductor devices while they are at the elevated temperature. The use of the elevated temperature accelerates stress to which the devices are subjected during burn-in, so that marginal devices that would otherwise fail shortly after being placed in service fail during burn-in and are eliminated before shipping. In electrical test, a more complete set of operating electrical bias levels and signals are supplied to the device to provide a thorough evaluation of its functions.

With respect to flash memory device testing, there is a lifetime limitation on the number of times each address within the device can be programmed. If one address is programmed then subsequently erased, the erasing is equivalent to programming since the state of the address is being changed. Given this limitation, it is crucial to note the number of programming operations consumed in the testing of the device to allow enough remaining program operations for use by the end user. Clearly, it is desirable to keep the number of programing operations used in testing as small as possible, consistent with adequate device testing.

In order to write data into the memory, the write operation may have to be repeated multiple times on the same address. The manufacturer of the device will define a maximum number of times that the operation may be repeated in order to imprint the data in the memory. If the number of repeated operations reaches this maximum without succeeding in imprinting the data during testing, then the device is deemed defective.

Due to the physical geometry associated with the device to be tested and process variations across its surface, addresses located in one area of the device may be successfully written with just a few iterations while addresses in another area of the same device may take considerably more. It is desirable to avoid over-programming those devices that can be programmed in a few operations and also ensure the opportunity of programming the devices that require a greater number of operations up to the maximum number. In order to achieve this objective, one must have the ability to control each device individually and keep track of the number of operations iterated on that particular device.

The typical flash memory test system, as presently practiced, is shown in FIG. 1. Each device 5 must be coupled to its own chip select pin 1 which completely enables or disables the device 5 from recognizing any operation that is being performed on it. Each chip select pin 1 allows several successive cycles of input in the following manner. A command is inputted to the device 5 that tells it what to do. For instance, the inputted data may command the device 5 to write, verify, or read. Finally, the data to be written onto the address follows the command.

The prior art systems have some limitations. Because each device 5 must be coupled to its own chip select pin 1, the present practice only allows one device (DUT) 5 to be operated on at one point in time per chip select pin 1. Additionally, because there is one signal line for each device, there must be as many signal lines as there are devices.

FIG. 2 shows the typical flash memory programming algorithm, as is presently practiced. The algorithm begins with initial conditions 10 of n=0 and count 12 (cnt)=0. The program begins by inputting commands and write data at 14 to a first address. It then verifies the data at 16 in the first address. If the device 5 has not been properly programmed at the first address, then the device under test (DUT) 5 fails the test at 18. Each time the test at 18 is failed, the algorithm checks at 20 to see if the count 12 has reached the maximum allowable number established by the manufacturer. If not, then the count 12 is increased by one and the next cycle of command, write, verify, and test to the first address is executed until either the count 12 reaches the maximum number allowed or the DUT 5 passes the test at 18. If the count 12 reaches the maximum number, then the DUT 5 is deemed a defective device 5. If, however, the DUT 5 passes the test at 18, the program moves to the next address and repeats the process. The program continues until it reaches the last address.

A typical example might be the testing of sixty-four devices 5, all being operated on in parallel by the set of inputs, with the maximum number of iterations set by the manufacturer as being twenty-five. Note that only one of the sixty-four devices 5 is enabled at a time. Because only one device 5 is enabled at one point in time, the testing process can be very time consuming and costly. The entire sequence would need to be repeated for each address up to the maximum number of iterations allowed in each of the sixty-four devices 5. Thus, 1,600 iterations would be needed to test this set of devices 5.

Current systems typically have sixty-four chip select signals per pattern generator and ten pattern generators. So typically, the maximum capacity of the present systems is six hundred-forty devices 5. Currently, it is impossible to determine the overall test time needed for these six hundred-forty devices 5 because the number of iterations needed to program each address is unknown.

Another aspect of the prior art systems is that in order for a test system to make more accurate timing measurements on a DUT 5, it is necessary that the delay times to transmit its signals between the test system and the DUT 5, commonly known as Round Trip Delay (RTD), must be taken into account. The RTD for the prior art can be a wide range for the different devices. This wide range can make it difficult to make timing measurements on the devices such as the propagation delay time or the access time. An accurate RTD time is necessary to know how much system delay to subtract out of the timing measurement. There is usually some compensation within the test hardware for some fixed amount of RTD. The remaining variable amount can be handled with either programmable hardware delays or software. However, the prior art calibrates only on a single round trip delay time for a single device 5.

SUMMARY OF THE INVENTION

A novel system and method for testing flash memory devices is herein disclosed. This system and method in accordance with this invention has unique software incorporated in a recording system. This recording system comprises individual hardware systems which keep track of the success of the programming, referred to as the state of the passflag, for each device under test. The recording system of the preferred embodiment contains two sets of latches which keep track of the state of the passflag. One set of latches keeps track of the state of the passflag on each data line of a device. The other latch is triggered when all the data passflags for an address of a device read true. The triggering of this second latch indicates that the data has been successfully programmed into the device under test. This recording system determines on a per address basis whether the device is defective and takes appropriate action independently of all other devices that are being tested in parallel. When the second latch has been set, indicating that an address has been correctly programmed, then the algorithm triggers a no-operation command. This no-operation command stops the programming at that address on that particular device. That address on that particular device passes the test and is no longer subjected to further testing.

The improved software and recording system desirably functions in conjunction with a system designed to perform parallel test and burn-in of devices, such as the MTX Massively Parallel Functional Test System (MTX) produced by Aehr Test Systems. The MTX can functionally test large quantities of devices in parallel, however, it only needs one pattern generator for the testing of all the devices. The unique system of two sets of latches within the recording system triggered by each device allows the multiple use of one pattern generator. This system of testing provides an effective and practical method for reducing overall test cost without sacrificing quality.

Because input signal lines are connected to numerous DUTs 5 rather than just one, and because many device 5 outputs are also connected to the same comparator there is no single RTD that can be used for a given test Board 47 of FIG. 7. There must be several RTDs, one for each chip select 1 state. This problem is solved by the compensation for appropriate round trip delay value by the timing generator 70 for each semiconductor device in each state selected by the chip select.

The present invention includes a method of testing a semiconductor device by coupling a passflag to a recording system. Commands and data are then sent to a first address of the device and this information is verified. If the data were not successfully written into the first address, the sending and verifying the write commands and data to the first address are repeated. The number of repeated attempts to successfully program the first address is counted. If this count reaches a given maximum, then the semiconductor device is rejected as defective. If the data are successfully written into the first address, the passflag is set to true. When the passflag is set to true, then the sending of write commands to the first address is terminated. All the preceding steps are repeated for successive addresses until the last address is reached.

Another aspect of the present invention is a system of testing semiconductor devices using a passflag signal generator indicating whether the semiconductor device is defective. A first set of latches is coupled to the passflag signal generator for keeping track of a state of a passflag signal generated by the passflag signal generator for each data bit of the semiconductor device. A second latch keeps track of a collective set of the first set of latches for each device.

A further aspect of the present invention is a semiconductor device testing apparatus with a pattern generator for generating a plurality of test signals for the semiconductor devices. An interface couples a plurality of semiconductor devices in parallel to the pattern generator. A plurality of test result readers are connected to the interface so that one of the plurality of test result readers can be coupled to each of the plurality of semiconductor devices. The pattern generator also compensates for appropriate round trip delay values.

In reviewing the following more detailed description and drawings of the present invention, the advantages and features of the invention should be more readily apparent to those skilled in the art.

BRIEF DESCRIPTION OF THE DRAWINGS

FIG. 1 is a typical prior art flash memory test system.

FIG. 2 is a typical prior art flash memory programming algorithm.

FIG. 3 is a representation of a portion of a flash memory test system in accordance with the present invention.

FIG. 4 is a schematic representation of a flash memory test system programming algorithm in accordance with the present invention.

FIG. 5 is a block diagram and schematic representation of a flash memory test system in accordance with the present invention.

FIG. 6 illustrates a small network of the flash memory testing system in FIGS. 3–5.

FIG. 7 illustrates a block diagram of the tester in FIG. 6.

FIG. 8 illustrates a large network of the flash memory testing system in FIGS. 3–5.

FIG. 9 illustrates the data flow in the flash memory testing systems of FIGS. 3–8.

FIG. 10a illustrates a typical prior art distribution pattern of signal lines flowing through the array of devices in a burn-in board.

FIG. 11 illustrates the pattern generator of the preferred embodiment.

DETAILED DESCRIPTION OF THE INVENTION

Figure 10B:
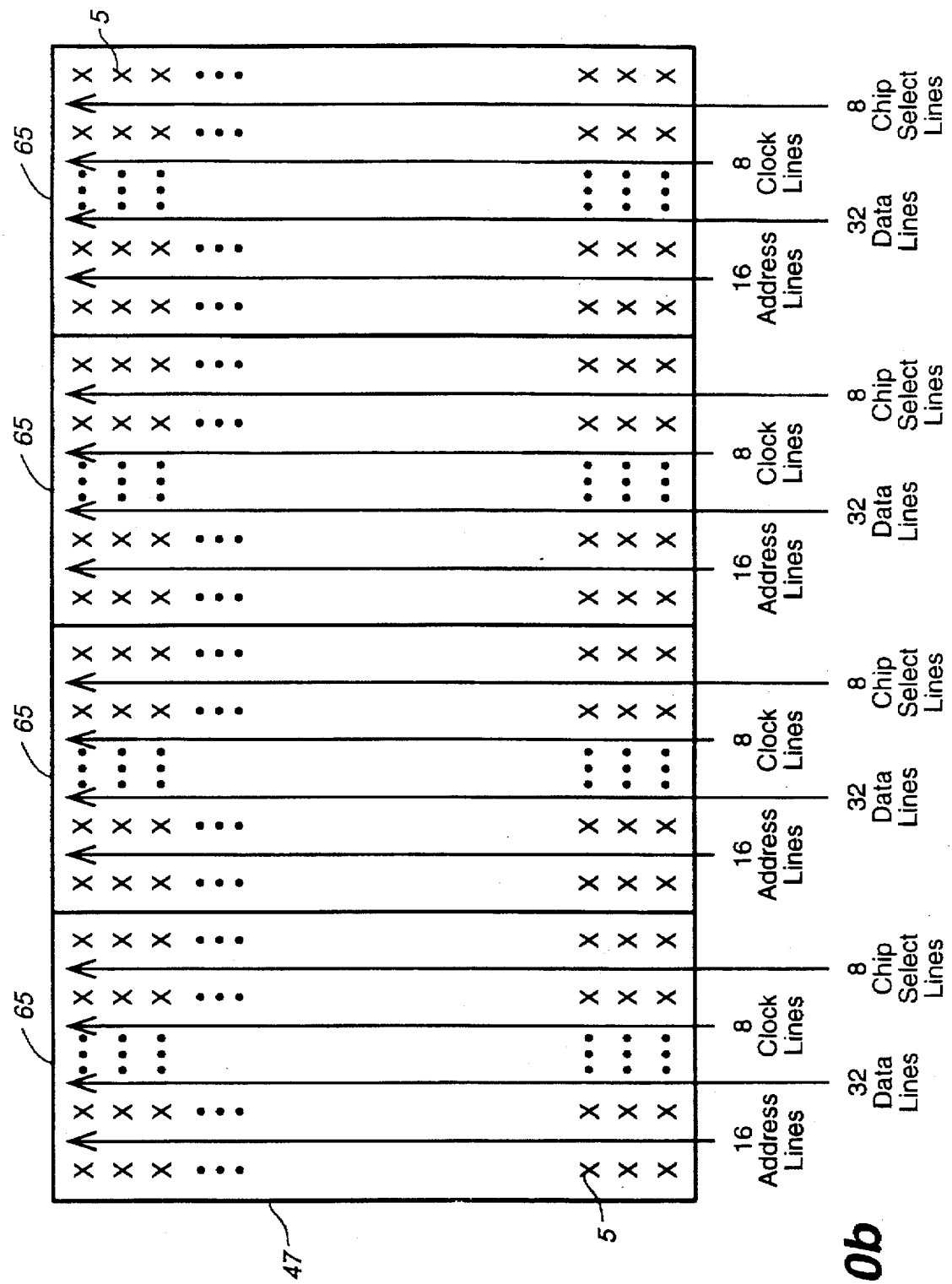
FIG. 10b illustrates the preferred embodiment configuration of the flow of signal lines through the array of devices in a burn-in board.

Turning now to FIG. 3, there is shown a portion of the present invention's flash memory test system. Unlike the prior art flash memory test systems illustrated in FIG. 1, the present invention allows individual chip select 1 signals to enable a multiplicity of devices 5 simultaneously. Only one pattern generator 45 of FIG. 7 is needed to test multiple devices 5. Although multiple devices are enabled simultaneously, the software combined with the pattern generator 45 acts as if it is testing only one part. This multiple enabling of devices 5 reduces both the testing time and testing costs.

The preferred embodiment utilizes chip select 1 signals which can service up to sixteen devices 5 simultaneously. It contains one hundred twenty-eight input/output (I/O) pins 25 which allows operations of sixteen 8-bit wide devices 5 at the same time per chip select 1. There are thirty-two chip select 1 lines and one hundred twenty-eight I/O pins 25 which can accommodate up to five hundred-twelve devices 5 in a given slot of the preferred embodiment. Since the preferred embodiment contains thirty slots, the present invention allows over 15,000 devices 5 to be tested at one time as opposed to the typical six hundred-forty devices 5 of the system shown in FIGS. 1–2.

The flash memory programming algorithm shown in FIG. 4 is used in the flash memory test system shown in FIG. 3. As in the prior art algorithm of FIG. 2, this improved algorithm performs the standard functions such as sending commands and data at 14, verifying data at 16, and counting the number of iterations at 12. However, in addition to those functions performed by the prior art algorithms, this improved algorithm contains the novel feature of utilizing recording system 30 to keep track of information for individual devices 5 that are being tested in parallel simultaneously.

The improved algorithm runs as follows. The address counter 10 and loop counter (cnt) 12 are initially set at zero. An additional initial condition is set at a passflag 32A which keeps track of the pass/fail status of each device 5. It is initially set to false which assumes that none of the devices 5 under test have passed at the beginning of the test. The program first inputs data at 14 into the first address. That address is then verified at 16 to ensure that data has been successfully programmed. If the data has been successfully programmed, then the state of the passflag 32 is set to true at 32B. Once the passflag 32 is set to true, DUT 5 associated with the true passflag 32 no longer receives a program command. Those parts receive a no-operation command at 36 which directs the device which has now been successfully programmed to do nothing. This task is accomplished by the coupling of the algorithm with a recording system 30 which is an individual hardware system for each DUT 5, i.e., there are 780 of the recording systems 30 in the system of FIG. 3. As for those parts which have not been successfully programmed, their individual pass flags 32 are still set at false. This false status of the passflag 32 signals the system to check at 20 to see if the count 12 has reached the maximum allowable number established by the manufacturer. If not, the count 12 is increased by one. Then the system repeats the loop of programming at 14 and verifying at 16 for that address until either the count 12 reaches the maximum number allowed or the DUT 5 passes the test 18. The pass/fail status of each part is individually recorded until the maximum number of loops set by the manufacturer has been reached. If the count 12 reaches the maximum number with the passflag 32 still in the false state, then the DUT 5 is deemed a defective device 5. If, however, the passflag 32 indicates a true state, then the DUT 5 passes the test 18 and the program moves to the next address and repeats the process. The program continues in this fashion until it reaches the last address.

Once the maximum number of loops in the algorithm has been reached for all of the parts of a DUT 5, all of the passflags 32 must be reviewed to determine which devices 5 have passed or failed. FIG. 5 shows the recording system 30 which interacts with the flash memory programming algorithm which performs this function of reviewing the passflags 32.

Initially, when all the passflags 32 are false, the data to be programmed into the part at 14 of FIG. 4, traverses through this recording system 30 and into the part. Then the verify operation at 16 is performed and the device outputs are compared to this data. The signals comparing the data are as wide as the bit width of the parts being tested.

Several different configurations of parts exist. For example, the part could be eight bits wide, sixteen bits wide, or eighteen bits wide. If, for example, the part is eight bits wide, then all eight bits would be verified. If any one of the eight bits failed to be correctly programmed, then the latch 40 of FIG. 5 associated with that part does not get set.

The latch 40 of FIG. 5 is associated with each device 5, so that in the preferred embodiment, there are sixteen latches 40 per chip select 1 of FIG. 3, one for each of the sixteen devices 5 being parallel processed per chip select 1. The latch 40 is set only if all the bits in the part pass. Additionally, the preferred embodiment has an additional set of error latches 41 of FIG. 5, which keeps track of the passflags of each data bit. Combined, the two sets of latches, latch 40 and error latch 41, enable the preferred embodiment to perform testing of multiple devices 5 with only a single pattern generator 45 of FIG. 7.

Once the programming is successful on all bits in an address, rather than presenting the normal sequence of addresses, data and commands outputted from the pattern generator 45, a static register holds the no-operation (no-op) 36 of FIG. 4 command. This no-op command 36 keeps the pattern generator 45 signal from reprogramming an address which has already been successfully programmed.

The improved algorithm and hardware system of the present invention may function in conjunction with a system designed to perform parallel test and burn-in of memory devices 5, such as the MTX Massively Parallel Functional Test System (MTX) produced by Aehr Test Systems as shown in FIG. 6. The MTX can functionally test large quantities of devices 5 in parallel. This system of testing provides an effective and practical method for reducing overall test cost without sacrificing quality. The MTX can test two hundred-fifty-six devices 5 or more on each device test board 47 of FIG. 7.

Each slot in the system can test up to one hundred-twenty-eight device I/O pins 25 of FIG. 3 in parallel. The system's pattern generator 45 of FIG. 7 and timing accuracy allows off-loading of long functional test patterns, data retention and refresh testing from conventional memory automatic test equipment (ATE) into the MTX massively parallel environment.

The device test board 47 can utilize reprogrammable pass/fail logic in the pattern generator which accommodates different configurations of devices without having to make physical changes. Alternatively, non-reprogrammable pass/fail logic can also be used as an option to reduce costs.

As a burn-in system, the MTX combines parallel functional test capabilities with traditional burn-in capabilities. The environmental chamber may have an operable testing temperature range from −55° C. to +250° C., however, the preferred testing temperature range is from −55° C. to +150° C. Because it is a test during burn-in system, the MTX detects a broader range of failures than the standard method of separate test and burn-in. Testing allows the absolute detection and identification of burn-in escapes and recoverable failures while it optimizes the burn-in duration. Testing also allows the exclusion of failed parts from further burn-in or test.

The system uses standard Ethernet with the TCP/IP network protocol. This provides a flexible networking structure. As shown in FIG. 8, the user can easily configure the network for a single system, or a large, complex network with many testers 51, debug stations 52, loaders and unloaders 50, user stations 55 and a network server 49.

Turning to FIG. 9, the network server 49 is a 486 (or higher) PC running UNIX. Some larger networks might require a workstation. The server 49 runs an industry standard database engine 57 that maintains the master program library and the test data library. When a run is started, the server 49 stores copies of all necessary test plans on the local controller hard disk. The run can then be completed, even if the network fails. The tester 51 saves all test results on the local controller hard disk until it can transfer the data back to the server 49. All reports are generated by the database engine 57 and can be evaluated or printed at the server 49 or the MTX tester 51.

In the event of a power failure, a backup power supply powers the local controller. The tester 51 shuts down immediately, but the local controller has time to execute a controlled shut down sequence so that it does not lose or corrupt data. When power is restored, the user can manually continue the run from the beginning of the last completed test step.

Extensive program debugging capabilities are included in the system. The user can select any step of any test program, modify any test condition, and immediately execute the modified program. The user can command the pattern generator 45 into a continuous loop and set a scope sync point to examine in detail the signals in the middle of a pattern.

The operator interface consists of a graphical display, a trackball or mouse, and a keyboard. The operator display can be in different languages. All normal production activities, such as loading and unloading lots, can be performed without the use of the keyboard. An optional printer can be added to facilitate printing of reports.

The MTX tester 51 performs all test functions. The tester 51 includes an operator interface which is used to control the operation of the tester 51, such as loading lots, unloading lots, requesting reports, or displaying status. The tester 51 houses all the test electronics, such as pattern generators 45 of FIG. 7, power supplies, drivers and receivers.

There are three different environmental chambers available with the MTX: the Hot Only, Hot/Cold to −20° C., and the Hot/Cold to −55° C.

The Hot Only chamber has a temperature range of approximately +45° C. to 150° C. This chamber is not sealed. The chamber draws cool air from the room as necessary, and vents hot air as necessary. It can either vent hot air into the room or into an exhaust duct. The Hot Only chamber can accommodate up to thirty test slots in the chamber for a nominal system capacity of 7680 devices 5.

The Hot/Cold chamber is sealed. A non-CFC refrigeration unit provides cooling below +45° C. The Hot/Cold chamber can accommodate up to sixteen test slots in the chamber for a nominal system capacity of 4096 devices 5. The Hot/Cold to −55° C. is an option which adds another mechanical stage of non-CFC refrigeration to the Hot/Cold chamber above.

In addition to the different environmental chambers, the MTX can provide multiple test zones. A schematic illustration of a test zone is shown in FIG. 7. Systems are usually configured with two zones (15 slots/zone in a Hot Only chamber, or eight slots/zone in a Hot/Cold chamber).

While the systems shown in FIGS. 1–2 typically have one pattern generator 45 for each slot, the MTX has one pattern generator 45 for each zone, each zone containing multiple slots. This system reduces the number of pattern generators 45 needed, thereby reducing testing costs. As shown in FIG. 7, each slot in a zone has a slot interface 59 and can include optional fault analysis 61. The pattern generator 45 is algorithmic and is capable of generating N, $N^{3/2}$, and $N^2$ patterns. As shown in FIG. 11, the pattern generator 45 includes a micro-sequencer 76, timing generator 70, address generator 72, data generator 74 and chip select generator 78. It also includes a pattern formatter 80 and state latches 82. The pattern formatter 80 distributes the data generator outputs across I/O lines and allows for multiplexing addresses onto data lines. The state latches 82 resynchronize the address data and chip select outputs to the master clock (TO). The pattern generator can generate all industry standard test patterns.

The micro-sequencer 76 controls all pattern generator 45 functions. It includes all of the control logic, loop, branching and subroutine logic and refresh timer. The micro-sequencer 76 also includes provisions for generating a scope sync pulse.

The MTX also utilizes a timing generator 70 which has multiple timing sets which facilitates the selection of different timing sets for every pattern state. Each timing set includes the cycle time for that set plus rising and falling edge locations for each of the clock channels. The system allows up to four edges per clock phase wherever they are appropriate.

The address generator 72 of the MTX generates sixteen-bits of logical X address, sixteen-bits of logical Y address and sixteen-bits of refresh address. The users can select most commonly used address patterns from a menu; however, for special pattern requirements there is an optional pattern assembler so one can write one's own unique patterns.

The optional address scrambler allows the user to change the map of logical memory locations to physical memory locations on the DUT.

Additionally, the address scrambler provides 32K×16 of vector memory behind both X and Y. The contents of the vector memories are addressed sequentially and are controlled by the micro-sequencer 76.

The MTX uses a data generator 74 which algorithmically generates eighteen-bits of unique logical data. In addition, there is a parity generator that can be used to generate data based on logical X and Y addresses. All common data patterns can be selected from a menu. If special patterns are desired, the pattern assembler can be used to generate unique data patterns.

The data generator 74 also has a very powerful data topological scrambler to convert logical data into physical data. It also provides vector memory. The contents of the vector memory are addressed sequentially and are controlled by the micro-sequencer.

The pattern generator 45 generates thirty-two chip select signals. The micro-sequencer 76 controls the chip select generation. For normal testing, the microsequencer enables a different chip select 1 signal to select a group of parts on the device test board 47 of FIG. 7. When the parts are being stressed, not tested, all thirty-two chip select signals are active.

The test slot interface 59 of FIG. 7 includes DUT 5 power supplies, signal drivers, data output comparators and pass/fail logic. Each slot has its own unique and independent supplies for DUT 5 power. All power supplies have a programmable current limit and over/under voltage protection. If the voltage, or current, exceeds any of the limits, only the slot that exceeds the limit shuts down. The tester 51 records any faults. The actual output voltage and actual output current for all supplies are read-back from each slot and reported at the tester 51 controller.

Each test slot has a total of one hundred twenty-eight I/O dryer channels 25 of FIG. 3, and thirty-two chip selects 1 of FIG. 1. In addition, there are two copies of the sixteen physical X-bits, two copies of the physical Y-bits, and four copies of the eight user clocks. These multiple copies are intended to be used on separate sections of the device test boards 47 of FIG. 7. This allows for a load reduction on each driver. This reduction provides maximum signal quality. All of the input signals can be monitored on the driver board 47 of FIG. 7 to insure that the drivers are working and that a part input is not shorting out a signal. The driver board 47 assembles the data and timing from the pattern generator 45 and provides the signals to the DUTs. Each of the one hundred twenty-eight data I/O channels 25 of FIG. 3 has a driver and a dual-level comparator. The physical data signals are duplicated, depending on the geometry of the part being tested, to fill this one hundred twenty-eight channel field: if the part is ×1, the data repeats one hundred twenty-eight times; if the part is ×4, the data repeats thirty-two times; if the part is ×8, the data repeats sixteen times; if the part is ×9, the data repeats fourteen times; if the part is ×16, the data repeats eight times; if the part is ×18, the data repeats seven times. There are three sets of programmable high and low levels for the drivers. One set of levels is used for the address drivers, one set is used for the data drivers and the last set is used for the clock and chip select drivers.

Each of the one hundred twenty-eight data I/O channels 25 of FIG. 3 has a dual-level comparator. There is one set of programmable high and low levels for all comparators. There is an error latch 40 of FIG. 5 for each of the one hundred twenty-eight comparators. Even though several devices 5 are typically connected to each I/O channel 25 of FIG. 3, the chip select 1 signals enable only one device 5 at a time per I/O channel 25.

Each test slot interface 59 of FIG. 7 has its own pass/fail logic. As each chip select 1 of FIG. 3 state is completed, the contents of the error latches 40 of FIG. 5 are stored and summed with prior results for that chip select 1 state. As a result, at the end of a test step, the accumulated pass/fail results for all one hundred twenty-eight I/O channels 25 of FIG. 3 for up to thirty-two chip select 1 states in each test slot allows for parallel testing of very large numbers of parts. The tester 51 of FIG. 6 uses software to indict parts on the device test board 47 of FIG. 7 depending on the mapping of I/O channel 25 of FIG. 3 and chip select 1 state to a given socket position.

In addition to the standard pass/fail logic, the MTX has the capability to perform extensive fault analysis 61 of FIG. 7. Additional circuitry for each slot provides this capability. The fault analysis 61 option can be used to gather two types of fault data: error count 12 of FIG. 4 and fail signatures.

For each I/O channel 25 of FIG. 3, there is a thirty-two-bit counter. Every time there is an error on a particular channel, the counter 12 is incremented. The total error count for each channel is reported.

The same circuitry captures fail signatures for each chip select state. A fail signature consists of the failing address and all failing data states. The failing address can be either the logical or physical address. The failing data state can be either the logical or physical data state.

The device test board 47 of FIG. 7 contains the devices 5 to be tested. The device test board 47 has an array of high-temperature sockets and terminations for the signal transmission lines. Devices 5 are loaded into the device test board 47 which in turn is then placed into the environmental chamber.

Appropriate terminations provide the best possible waveforms to the devices 5 being tested. Termination values are unique to each device test board 47 type and depend greatly on the characteristics of the device 5 to be tested. In order for the correct terminations to be determined, the device test board 47 must be populated with the actual devices 5 for which it is designed.

When a Test System generates an input signal to a DUT 5, that signal originates within the tester 51, and then must be transmitted through the pin driver, and then through some sort of interconnect circuitry (including a test socket or handler contractor) before it actually arrives at the DUT 5 input pin. This process involves some amount of delay time (Ti) that is dependent on the fixturing and will vary from fixture to fixture.

Likewise, when the Test System is testing an output signal from the DUT 5, the signal must be transmitted from the DUT 5 output pin through some interconnect circuitry, through the pin receiver and on into the electronics where the actual test is performed. This also involves some amount of delay (To) that is dependent on the fixturing and will vary from fixture to fixture. It may also be different than the Ti because of differences in test electronic path delays.

In order for a Test System to make more accurate timing measurements on a DUT 5, it is necessary that the delay times to transmit its signals between the test system and the DUT 5., commonly known as Round Trip Delay (RTD), must be taken into account. The RTD for the prior art can be a wide range for the different devices. This wide range can make it difficult to make timing measurements on the devices such as the propagation delay time or the access time. An accurate RTD time is necessary to know how much system delay to subtract out of the timing measurement. There is usually compensation within the test hardware for some fixed amount of RTD. The remaining variable amount can be handled with either programmable hardware delays or software. In this way, the tester 51 of FIG. 6 can make an accurate timing measurement on the DUT 5. However, the prior art calibrates only on a single round trip delay time for a single device 5.

The problem is more complex, however, in the case of the MTX. Because input signal lines are connected to numerous DUTs 5 rather than just one, and because many device 5 outputs are also connected to the same comparator there is no single RTD that can be used for a given test board 47 of FIG. 7. There must be several RTDs, one for each chip select 1 state.

When an MTX Test Board 47 is designed and then first fabricated, it is characterized to determine the appropriate RTD value for each chip select 1 state. This set of values is stored in the data base and associated with that particular test board 47 design. When the test board 47 design is used in the MTX System, the appropriate chip select 1 RTD values are read from the data base and stored in a memory that is accessed, at pattern speed, and used with a set of high-precision programmable delay lines to invoke the appropriate RTD value for a given chip select 1 state. In addition to the chip select 1 signals selecting the group of devices 5, the chip select signal is also used to select which of the round trip delay times to use when testing those devices 5. The timing generator 70 then compensates for appropriate round trip delay value for each semiconductor device in each state selected by the chip select. Since the information is stored in hardware memory, there is no need to wait for a new software download or calculation. In this way, the MTX can always provide the maximum overall timing accuracy, even though the effective fixturing delays change throughout the course of a test.

Turning now to FIG. 10a, the burn-in board 47 has multiple devices 5 placed in an array with multiple data lines, clock lines, and chip select signals. A burn-in board design compatible with the present invention is taught in U.S. patent application Ser. No. 08/161,282, filed Dec. 1, 1993, the disclosure of which is incorporated by reference. An example might be a 16×16 array of devices 5 with sixteen address lines, thirty-two data lines, eight clock lines, and thirty-two chip select lines going into the board 47. These signal lines must be distributed around the ban-in board 47 to each device 5. A typical distribution pattern is shown in FIG. 10a. Some very complex routing of the signals may be required to reach each device 5. The preferred embodiment, as shown in FIG. 10b, has divided the board into sections where each section has duplicate sets of signals. For example, the board 47 in the preferred embodiment could be sectioned off into four sections 65. Working with the previous example, each quadrant 65 has sixteen address lines, thirty-two data lines, eight clock lines and eight chip select lines. Each section 65 has the same number of their respective lines with the total of chip select lines from all the sections equaling thirty-two. The signal lines can now go in a straight line across the board 47 rather than having to go through complex configurations. The advantages of this configuration is that the trace length will be cut by almost ¾, thus reducing the RTD of the devices 5, and the loading is cut by ¾ which vastly improves the signal quality.

Each device test board 47 is identified by a unique seven digit serial number. Each digit is passively encoded using resistors on the device test board 47. High temperature 680 pin card-edge connectors provide the interconnection mechanism between the device test board 47 and the system.

The MTX is equipped with extensive self-test and diagnostics capabilities. Each board 47 in the system performs a confidence test on itself at power-up. This confidence test is designed to provide a fast verification of basic functionality. In addition, the user can perform more extensive diagnostics. The diagnostics are intended to isolate a failure to a replaceable subassembly whenever possible. The system requires almost no manual calibration.

Optional equipment includes the user station 55 which is a remote PC connected to the MTX network. The user station 55 can be used for off-line program development, production control (lot definition, status inquiry, etc.) and network administration.

Another example of optional equipment is an ambient test station or debug station 52. The debug station 52 is a simplified tester 51. It includes test electronics for one slot, but no environmental chamber, so that full electrical tests can be performed in an ambient environment. It also provides easy user access to the device test board 47 and test electronics. This station can be used to check-out the functionality of new test programs, signals and patterns, and verify voltages. The station can also be used to repair test electronics or device test boards 47 and pre-screen loaded device test boards 47 before they are put into a tester 51. This helps to identify, fix, or mask devices 5 that are making poor contact, are in bad socket positions, or are initially defective.

A further option is to utilize the MTX's design for interfacing with an intelligent automatic loader/sorter system. When the intelligent loader/sorter system is attached to the network, the server 49 can provide a unique, predefined loading mask to the loader for each device test board 47 to indicate bad socket positions that should not be loaded. After the parts have been tested, the server 49 can provide a unique sorting map to an intelligent unloader.

It should be apparent to those skilled in the art that various changes in form and details of the invention as shown and described may be made. It is intended that such changes be included within the spirit and scope of the claims appended hereto.

What is claimed is:

1. A method of testing a plurality of semiconductor devices which comprises the steps of:

coupling a passflag to a recording system for each individual semiconductor device of said plurality of semiconductor devices;

sending write commands and data to a first address of said plurality of semiconductor devices in parallel;

verifying said data on the first address for each individual semiconductor device in parallel;

if said data were not successfully written into the first address for all of said plurality of semiconductor devices, repeating the steps of sending and verifying said write commands and data to the first address only for those of said plurality of semiconductor devices for which said data were not successfully written into the first address;

counting the number of repeated attempts to successfully program the first address;

if said count of repeated attempts reaches a given maximum, then rejecting any of said plurality of semiconductor devices for which said data were not successfully written into the first address as defective;

if said data are successfully written into the first address of all of said plurality of semiconductor devices, then terminating any further write attempts to the first address;

if said data are successfully written into the first address of a particular one of said plurality of semiconductor devices, setting said passflag for that particular one of said semiconductor devices to true;

if said passflag for that particular one of said semiconductor devices is set to true, terminating the sending of write commands to the first address for that particular one of said semiconductor devices; and repeating all the preceding steps for successive addresses until a last address is reached.

2. The method of claim 1 in which said steps more specifically comprise, separately for each of said semiconductor devices:

setting a loop count to 0;

setting n to 0;

setting address to n;

setting pass flag to false;

sending commands to address=n;

sending dam to address=n;

verifying said data at address=n;

if address=n has not been successfully programmed, then checking to see if the loop count has reached the maximum number;

if the loop count is less than maximum number allowed, then adding one to the loop count; then re-sending said command and data to address=n and repeating the step of verifying said data;

if the loop count has reached maximum, then checking a state of said passflag;

if the passflag is still set to false, then rejecting that particular one of said plurality of semiconductor devices as defective;

if address=n has been successfully programmed, then setting the passflag for that particular one of said plurality of semiconductor devices to true;

if the passflag is set to true, then terminating the sending of write commands by sending no-operation commands to the first address for that particular one of said plurality of semiconductor devices and adding 1 to n; and repeating the preceding steps beginning at sending commands to address=n.

3. The method of claim 1 in which said recording system coupled with said passflag is an individual hardware system for each device under test.

4. The method of claim 1 in which said recording system coupled with said passflag keeps track of the state of said passflag.

5. The method of claim 4 in which the state of said passflag is either true or false.

6. The method of claim 1 in which said recording system comprises:
   a first set of latches for keeping track of the state of said passflag for each data bit of a device; and
   a second latch for keeping track of the first set of latches.

7. The method of claim 6 in which the device under test is coupled to both the first set of latches and the second latch.

8. A system of testing semiconductor devices using the memory programming algorithm of claim 1 in which a testing apparatus is coupled with said algorithm for performing parallel tests of devices.

9. The system of testing semiconductor devices of claim 8 in which said testing apparatus includes:
   a pattern generator for generating information to be inputted into devices under test; and
   a device test board connected to said pattern generator for facilitating said semiconductor devices to be tested.

10. The system of testing semiconductor devices of claim 9 in which one pattern generator generates information to be inputted into a multiplicity of devices.

11. The system of testing semiconductor devices of claim 9 in which said system utilizes reprogrammable pass/fail logic for accommodation of different configurations of devices.

12. The system of testing semiconductor devices of claim 9 in which said device test board is divided into a multiplicity of sections where each section has its own set of signals.

13. The system of testing semiconductor devices of claim 9 in which said pattern generator comprises:
   a chip selector for enabling semiconductor devices to be tested; and
   a timing generator with a multiplicity of timing sets.

14. The system of testing semiconductor devices of claim 13 where said timing generator variably compensates for appropriate round trip delay value for each group of semiconductor devices selected by said chip selector.

15. The system of testing semiconductor devices of claim 13 in which said chip selector enables a multiplicity of said semiconductor devices simultaneously.

16. The system of claim 13 in which said pattern generator further comprises:
   a micro-sequencer to control said pattern generator functions;
   an address generator to select or create address patterns; and
   a data generator to select or create unique data patterns.

17. The system of testing semiconductor devices of claim 13 in which said testing apparatus further includes a driver board to assemble information from the pattern generator and provide signals to the devices.

18. The system of testing semiconductor devices of claim 9 in which said testing apparatus further includes an unsealed hot chamber with a temperature range of approximately +45° C. to +250° C.

19. The system of testing semiconductor devices of claim 18 in which said hot chamber draws cool air as necessary and heats air as necessary.

20. The system of testing semiconductor devices of claim 9 in which said testing apparatus further includes a sealed hot/cold chamber with a low temperature range of below +45° C.

21. The system of testing semiconductor devices of claim 9 in which said testing apparatus further includes an ambient station which does not require a temperature control.

22. The method of claim 1 in which the sending of write commands to the first address for that particular one of said semiconductor devices is terminated by sending a no-operation command to the first address for that particular one of said semiconductor devices.

23. A system of testing semiconductor devices comprising:
   a passflag signal generator coupled to a memory programing algorithm for performing parallel tests Of devices indicating whether the semiconductor devices are defective;
   a first set of latches coupled to said passflag signal generator for keeping track of a state of a passflag signal generated by the passflag signal generator for each data bit of each semiconductor device; and
   a second latch for keeping track of a collective set of the first set of latches for each device;
   said algorithm comprising the steps of, for each of the semiconductor devices:
   sending commands and data to a first address;
   verifying said data at the first address;
   if said data were not successfully programmed onto the first address, repeating the steps of sending and verifying said commands and data onto the first address;
   counting the number of repeated attempts to successfully program the first address:
   if said count of repeated attempts reaches a given maximum, then rejecting that particular one of the semiconductor devices as defective;
   if said data are successfully programmed onto the first address, setting said passflag signal to true for that particular one of the semiconductor devices;
   if said passflag is set to true, terminating the sending of write commands to the first address for that particular one of the semiconductor devices; and
   repeating all the preceding steps for successive addresses until a last address is reached.

24. The system of testing semiconductor devices of claim 23 in which the state of said passflag is either true or false.

25. The system of testing semiconductor devices of claim 24 in which said algorithm more specifically comprises, separately for each of the semiconductor devices:
   setting a loop count to 0;
   setting n to 0;
   setting address to n;
   setting said passflag signal to false;
   sending commands to address=n;
   sending data to address=n;
   verifying said data on address=n;
   if said data are successfully written into the first address of all of said plurality of semiconductor devices, then terminating any further write attempts to address=n;
   if address=n has not been successfully programmed, then checking to see if the loop count has reached the maximum number;
   if the loop count is less than maximum number allowed, then adding one to the loop count; then re-sending said command and data to address=n and repeating the step of verifying said data;

if the loop count has reached maximum, then checking to see a state of said passflag signal, wherein said passflag signal is coupled to a recording system;

if said passflag signal is still set to false, then rejecting that particular one of the semiconductor devices as defective;

if address=n has been successfully programmed, then setting said passflag signal to true for that particular one of the semiconductor devices;

if said passflag signal is set to true, then terminating the sending of write commands by sending no-operation commands to the first address for that particular one of the semiconductor devices and adding 1 to n; and repeating the preceding steps beginning at sending commands to address=n.

26. The system of testing semiconductor devices of claim 22 further comprising a testing apparatus coupled with said algorithm.

27. The system of testing semiconductor devices of claim 26 in which said testing apparatus includes:
 a pattern generator for generating information to be inputted into devices under test; and
 a device test board connected to said pattern generator for facilitating said semiconductor devices to be tested.

28. The system of testing semiconductor devices of claim 27 in which one pattern generator generates information to be inputted into a multiplicity of devices.

29. The system of testing semiconductor devices of claim 27 in which said system utilizes reprogrammable pass/fail logic for accommodation of different configurations of devices.

30. The system of testing semiconductor devices of claim 27 in which said device test board is divided into a multiplicity of sections where each section has its own set of signals.

31. The system of testing semiconductor devices of claim 27 in which said pattern generator comprises:
 a chip selector for enabling semiconductor devices to be tested; and
 a timing generator with a multiplicity of timing sets.

32. The system of testing semiconductor devices of claim 31 in which said timing generator compensates for appropriate round trip delay value for each semiconductor device in each stab selected by said chip selector.

33. The system of claim 31 in which said pattern generator further comprises:
 an address generator to select or create address patterns;
 a data generator for selecting or creating unique data patterns; and
 a micro-sequencer to control said pattern generator functions.

34. The system of testing semiconductor devices of claim 31 in which said chip selector enables a multiplicity of said semiconductor devices simultaneously.

35. The system of testing semiconductor devices of claim 31 in which said testing apparatus further includes a driver board to assemble the information from the pattern generator and provide signals to the devices.

36. The system of testing semiconductor devices of claim 27 in which said testing apparatus further comprises an unsealed hot chamber with a temperature range of approximately +45° C. to +250° C.

37. The system of testing semiconductor devices of claim 36 in which said hot chamber draws cool air as necessary and heats air as necessary.

38. The system of testing semiconductor devices of claim 27 in which said testing apparatus comprises a sealed hot/cold chamber with a low temperature range of below +45° C.

39. The system of testing semiconductor devices of claim 27 in which said testing apparatus comprises an ambient station which does not require a temperature control.

40. A method of testing a plurality of semiconductor devices which comprises the steps of:
 generating a plurality of test signals for the semiconductor devices;
 coupling a plurality of semiconductor devices in parallel to receive the plurality of test signals;
 coupling a plurality of test result readers to each of said plurality of semiconductor devices;
 variably compensating for appropriate round trip delay value for different groups of the semiconductor devices;
 generating the plurality of test signals comprising the steps of, for each of the plurality of semiconductor devices:
 sending commands and data to a first address;
 verifying said data at the first address;
 if said data were not successfully programmed onto the first address, repeating the steps of sending and verifying said commands and data onto the first address;
 counting the number of repeated attempts to successfully program the first address;
 if said count of repeated attempts reaches a given maximum, then rejecting that particular one of the plurality of semiconductor devices as defective;
 if said data are successfully programmed onto the first address, setting said passflag signal to true for that particular one of the plurality of semiconductor devices;
 if said passflag is set to true, terminating the sending of write commands to the first address for that particular one of the plurality, of semiconductor devices; and
 repeating all the preceding steps for successive addresses until a last address is reached.

41. A semiconductor device testing apparatus, which comprises:
 a pattern generator for generating a plurality of test signals for the semiconductor devices;
 an interface for coupling a plurality of semiconductor devices in parallel to said pattern generator, and
 a plurality of test result readers connected to said interface so that one of said plurality of test result readers can be coupled to each of said plurality of semiconductor devices;
 where said pattern generator variably compensates for appropriate round trip delay value for different groups of the semiconductor devices.

42. The semiconductor device testing apparatus of claim 41 in which said interface for coupling is a chip selector which enables a multiplicity of said semiconductor devices simultaneously.

43. The semiconductor device testing apparatus of claim 41 in which said pattern generator includes a timing generator with a multiplicity of timing sets.

44. The semiconductor device testing apparatus of claim 43 in which the timing generator variably compensates for appropriate round trip delay value for different groups of the semiconductor devices.

45. The semiconductor device testing apparatus of claim 41 in which said pattern generator further comprises:
- a micro-sequencer to control said pattern generator functions;
- an address generator to select or create address patterns; and
- a data generator for selecting or creating unique data patterns.

46. The semiconductor device testing apparatus of claim 41 in which said testing apparatus further comprises a driver board to assemble information from the pattern generator and provide signals to the devices.

47. The semiconductor device testing apparatus of claim 41 further comprises an unsealed hot chamber with a temperature range of approximately +45° C. to +250° C.

48. The semiconductor device testing apparatus of claim 47 in which said hot chamber draws cool air as necessary and heats air as necessary.

49. The semiconductor device testing apparatus of claim 41 in which said testing apparatus comprises a sealed hot/cold chamber with a low temperature range of below +45° C.

50. The semiconductor device testing apparatus of claim 41 in which the semiconductor devices are mounted in a device test board and said device test board is divided into a multiplicity of sections where each section has its own set of signals, including a chip select sisal to enable a group of devices in that section for testing.

* * * * *